(12) United States Patent
Fukui

(10) Patent No.: US 6,195,439 B1
(45) Date of Patent: Feb. 27, 2001

(54) VOICE SIGNAL PROCESSOR

(75) Inventor: Takao Fukui, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/147,741

(22) PCT Filed: Jul. 9, 1998

(86) PCT No.: PCT/JP98/03074

§ 371 Date: Jun. 1, 1999

§ 102(e) Date: Jun. 1, 1999

(87) PCT Pub. No.: WO99/03199

PCT Pub. Date: Jan. 21, 1999

(30) Foreign Application Priority Data

Jul. 9, 1997 (JP) .................................................. 9-183924

(51) Int. Cl.[7] ..................................................... H03G 3/00
(52) U.S. Cl. ........................ 381/104; 381/98; 381/119; 381/123
(58) Field of Search ..................................... 381/104, 105, 381/98, 101, 102, 103, 107, 119, 123

(56) References Cited

U.S. PATENT DOCUMENTS 5,883,963 * 3/1999 Tohella .................................. 381/104

FOREIGN PATENT DOCUMENTS 5-292592 * 11/1993 (JP) .
6-46490 * 2/1994 (JP) .

* cited by examiner

Primary Examiner—Minsun Oh Harvey
(74) Attorney, Agent, or Firm—Jay H. Maioli

(57) ABSTRACT

A signal output is taken out from the input stage or respective output stages of the signal characteristic processing means through a signal line selected by selecting means. In accordance with the taken signal, the level control signal generating means sets the output level of the audio output signal. Then, the output level setting means sets the output level of the audio output signal in accordance with the level control signal outputted by the level control signal generating means. Therefore, the switching noise due to switch signal lines by selecting means is prevented from entering into an audio output signal during the processing of the output level of the audio input signal.

2 Claims, 4 Drawing Sheets

VOICE SIGNAL PROCESSOR

TECHNICAL FIELD

The present invention relates to an audio signal processing apparatus and is suitably applicable to an audio input signal processing apparatus, such as an audio mixer, which controls the frequency characteristics and amplitudes of audio input signals when the audio input signals are mixed, for example.

BACKGROUND ART

Conventionally, an audio mixer used for processing audio signals is equipped with a frequency processing section and an amplitude processing section. The frequency processing section includes, for example, filters which controls the frequency characteristics of the inputted audio signal. The amplitude processing section is generally referred to as a fader or a dynamics which changes the amplitudes of the inputted audio signal. Using these sections, a signal processing usually called an effect processing is performed for the frequency characteristics and amplitudes of the inputted audio signal.

When performing the effect processing to change the frequency characteristics, two frequency processing operations such as rejection of signal components by a filter and emphasis of signal components by an equalizer can be carried out in any order and the resulting frequency characteristics are the same.

If the audio signal inputted to the audio mixer has a signal level below the predetermined threshold, then performing the amplitude processing on the audio signal using, for example, a compressor will not cause any changes in the amplitude of the audio signal. In contrast, if an equalizer is placed at the former stage of the compressor so as to increase the amplitude level of the signal in a predetermined frequency range to a level above the threshold and then an amplitude processing is performed, the amplitude of the output signal varies in accordance with that of the input signal. In other words, the characteristics of the output signals are different whether the equalizer performs the amplitude processing before the amplitude processing of the compressor or not. Therefore, when processing signals using the audio mixer, the amplitude processing is usually performed on input signal at a fixed stage taking into consideration the influence of the amplitude processing.

In order to perform the amplitude processing on output signals having a variety of frequency characteristics and amplitude characteristics, it has been proposed to perform the effect processing by adding a switcher which allows switching of the dynamics to desired stages of the frequency processing and/or amplitude processing.

Referring to FIG. 3, in a mixer 1, an input trim 3 performs fine adjustment on an audio input signal S1 which is inputted from an input terminal 2 thereto, and outputs the adjusted signal to a frequency processing section 1A so as to perform the frequency processing for each frequency range.

The audio input signal S1, which is inputted via the input terminal 2, is sent out through a main signal line BL to a signal characteristic processing section which includes an amplitude processing section, such as a fader 7, and the frequency processing section 1A. When the signal passes through the frequency processing section 1A, a high-pass filter (HPF) 4 rejects a DC component of the signal and low frequency noise components such as the sounds of wind, and a low-pass filter (LPF) 5 rejects high frequency noise components. Further, an equalizer (EQ) 6 emphasizes or rejects, for example, the voices (vocal) of human beings and particular sounds of music instruments such as cymbals. After the frequency processing performed by the respective stages of the frequency processing section 1A, the fader 7 adjust the output level of the audio signal and an output terminal 8 outputs the adjusted audio signal.

The mixer 1 includes selector switches SW1 to SW7 which connect and disconnect between the input terminal 2, input trim 3, high-pass filter 4, low-pass filter 5, equalizer 6, fader 7, and output terminal 8. The selector switches SW1 to SW7 have their respective contacts connected to a dynamics 10 via matrix switchers 9A and 9B. The matrix switchers 9A and 9B are switched so as to place the dynamics 10 between any adjacent two of input terminal 2, input trim 3, high-pass filter 4, low-pass filter 5, equalizer 6, fader 7, and output terminal 8.

FIG. 4(A) illustrates the selector switches SW (SW1 to SW7) which selectively switch the main signal line BL that connects the input terminal 2, input trim 3, fader 7, output terminal, and the respective frequency processing sections, each of the selector switches having four contacts 11A, 11B, 12A, and 12B. For example, when the dynamics 10 is selected, the contacts 11A is connected to the contact 12A and the contact 11B is connected to the contact 12B as shown in FIG. 4(B). At the other stages where the dynamics 10 is not inserted, the contacts 11A are connected to the contacts 11B and the contacts 12A are not connected to the contacts 12B as shown in FIG. 4(C).

The dynamics 10 includes signal amplitude processing means such as a limiter and compressor that decreases an high output level, and an expander and a gate that cuts cross talk appearing in the low output level. Thus, using the matrix switchers 9A and 9B, the mixer 1 performs the amplitude processing on the inputted audio input signal S1 based on an output signal from any one of the input terminal 2, input trim 3, high-pass filter 4, low-pass filter 5, equalizer 6, fader 7, and output terminal 8, in order to output an output signal, that is, the mixer 1 sets the output level.

Since the mixer 1 having the aforementioned configuration inserts the dynamics 10 into a desired stage of the main signal line BL by switching the selector switches SW1 to SW6, the apparatus suffers from a problem that the audio input signal S1 is disconnected during a moment when the selector switches are switched and switching noise generated by the switchers is mixed with the audio signal which is being transmitted over the main signal line BL.

Also, the buses in matrix form in the matrix switchers 9A and 9B are complex in construction and costly accordingly. In order to prevent the audio input signal S1 from being disappearing during the switching operation, the matrix switchers 9A and 9B provided in the mixer 1 should be switched by a selection signal having a time constant. This makes the construction of the switcher more complex.

DISCLOSURE OF THE INVENTION

The present invention was made in view of the aforementioned drawbacks. The present invention provides an audio signal processing apparatus where switching noise is prevented from entering into the transmitted signal when switching to selectively derive an output from a desired stage of the signal characteristic processing section which performs the frequency processing and/or the amplitude processing on the signal when setting output level of the output signal.

In order to solve the aforementioned drawbacks, an apparatus according to the present invention has one or a plurality of signal characteristic processing means which receives an audio input signal and changes the frequency characteristic and amplitude characteristic of the audio signal; a plurality of signal lines which receive a signal output from an input stage of a signal characteristic processing means into which the audio signal enters, and from the output stage of one or a plurality of signal characteristic processing means; a level control signal generating means which generates a control signal for determining an output level on the basis of the signal output received over the signal lines selected, the output level being determined in accordance with the output of a selecting means which selects one of a plurality of signal lines; and an output level setting means which adjusts the output level on the basis of an output signal derived from a selected signal characteristic processing means, and outputs as an audio output signal from the apparatus, the output level being adjusted in accordance with the level control signal. Thus, the apparatus of the invention can prevent switching noise from entering an audio output signal of the apparatus, the switching noise resulting from the switching operation of the signal lines when the level of the audio output signal of the apparatus is adjusted on the basis of the signal derived from the signal characteristic means over the selected signal lines.

BEST MODE FOR CARRYING OUT THE INVENTION

Figure 1:
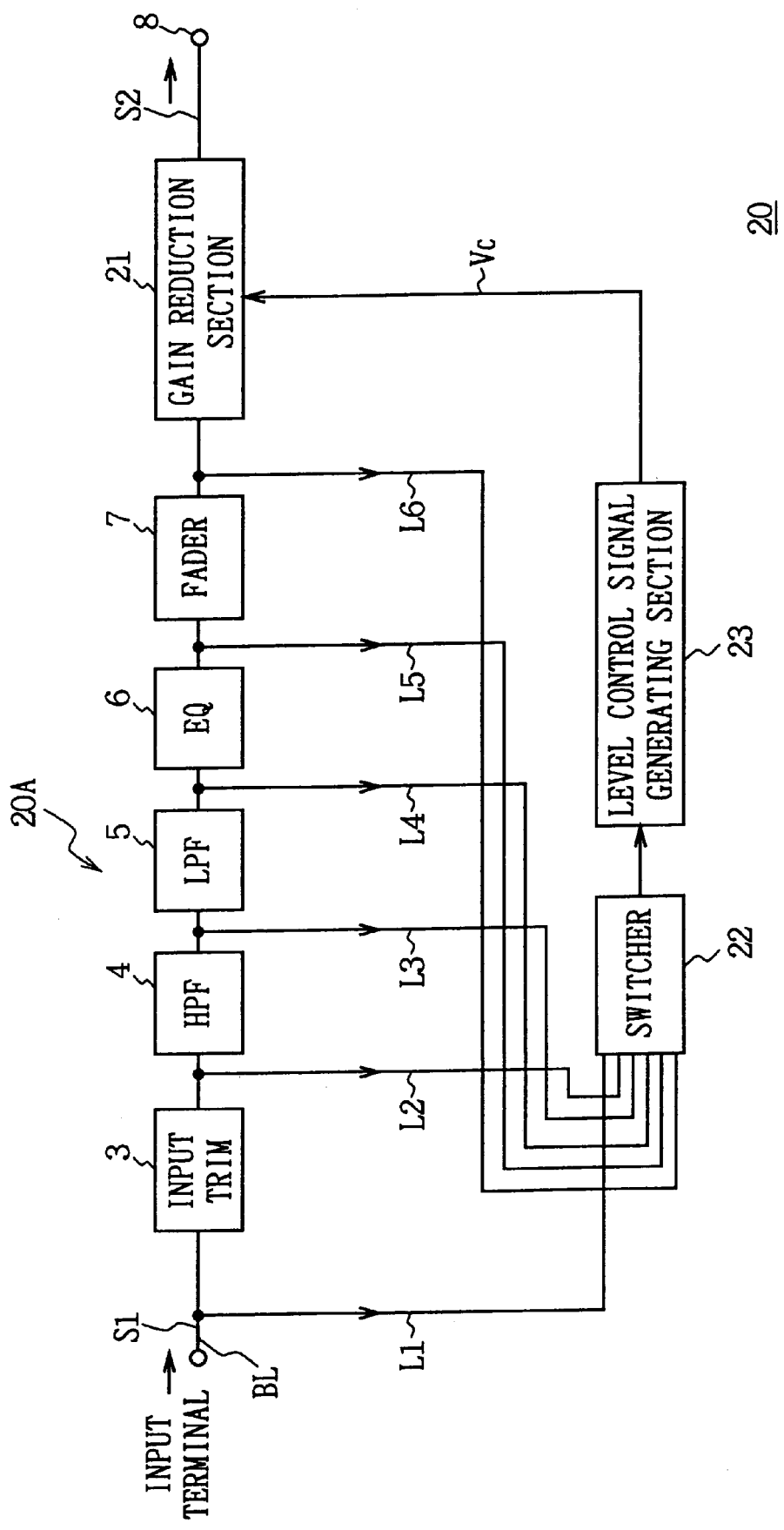
FIG. 1 is a schematic block diagram illustrating the configuration of an audio signal processing apparatus according to the present invention.
Figure 3:
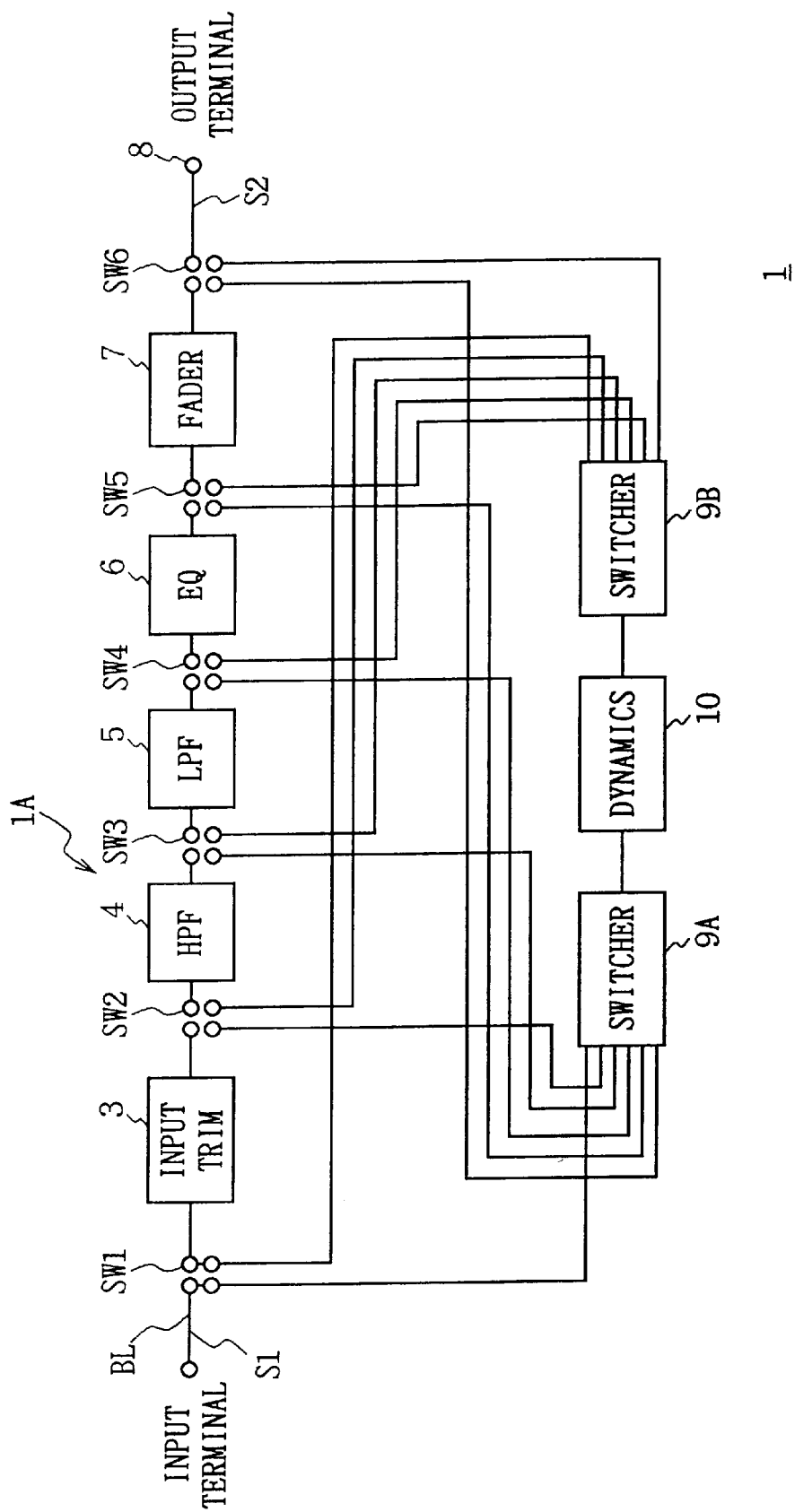
FIG. 3 is a schematic block diagram illustrating a conventional audio signal processing apparatus.
Figure 4:
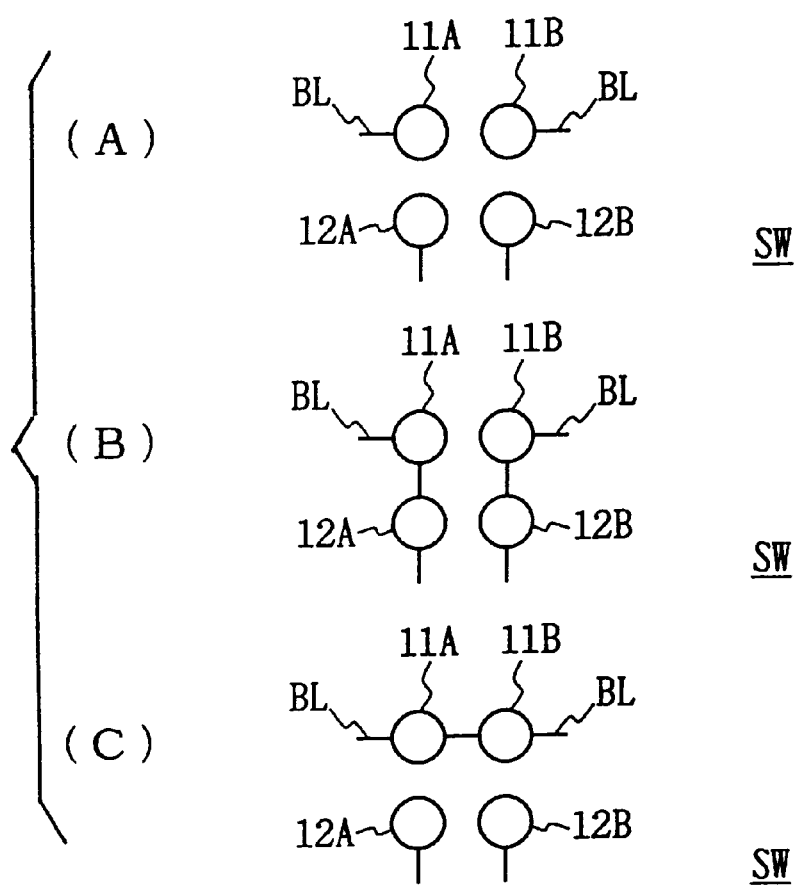
FIG. 4 is a schematic diagram explaining a selector switch.

An embodiment of the present invention will be described in detail with reference to the drawings.
(1) Configuration of Mixer In FIG. 1 in which the same reference numerals are applied to parts corresponding to FIG. 3, reference numeral 20 generally denotes a mixer which processes an audio input signal S1 digitally processed. The input trim 3 receives the audio input signal S1 through a main signal line BL from an input terminal 2 and performs fine adjustment of the signal level of the audio input signal S1. The frequency processing section 20A which includes a high-pass filter 4, a low-pass filter 5, and an equalizer 6 performs the frequency processing on the audio input signal S1. Thereafter, the level of the audio signal outputted from the frequency processing section 20A is adjusted to a prescribed output level by the fader 7 and is subsequently outputted to a gain reduction section 21 which decreases the output level of the audio signal.

The outputs of the input terminal 2, input trim 3, high-pass filter 4, low-pass filter 5, equalizer 6, and fader 7 are connected to a switcher 22 with the signal lines L1 to L6, respectively, and selectively connected via the switcher 22 to a level control signal generating section 23.

In other words, the switcher 22 selectively connects the each signal line L1 to L6 to the level control signal generating section 23, thereby supplying the level control signal generating section 23 with audio signal outputted from the input terminal 2, input trim 3, fader 7, output terminal 8, and the output stages in the frequency processing section 20A.

In reality, signal lines are selected depending on the purposes of the audio signal processing. When producing audio signals for, for example, broadcasting, the signal level is often controlled on the basis of an output signal from the signal line L6 such that the output level from the final stage meets the requirements of the broadcasting regulations.

When performing the audio signal processing for, for example, the recording of a compact disk (CD), only the required audio signal is derived after low noise components have been rejected and a level-control is performed on the derived audio signal. Therefore, the signal line L3 following the high-pass filter 5 may be selected. Conversely, the signal line L2 preceding the high-pass filter 5 may be selected so that the entire output level of the audio signal is decreased and thereafter the signal may be subjected to the frequency processing.

The level control signal generating section 23 produces a control voltage Vc as a control signal for setting an output level with respect to, on the basis of the audio signal derived through any one of the signal lines L1 to L6 selectively switched by the switcher 22. The control voltage Vc is outputted to the gain reduction section 21 composed of a DSP (Digital Signal Processor).

In this case, if the input level derived from the signal line is higher than a prescribed lower threshold $V_{th1}$ and lower than a predetermined upper threshold $V_{th2}$, the output level is set equal to the input level. Therefore, the level control signal generating section 23 sets a control voltage Vc to 1.0.

If the input level derived from the signal line is lower than the prescribed lower threshold $V_{th1}$ or higher than the prescribed upper threshold $V_{th2}$, the level control signal generating section 23 computes a reduction amount of the output level, produces and outputs the control voltage Vc according to the reduction amount to the gain reduction section 21. In this manner, the gain reduction section 21 can perform the level control according to the signal output of audio signal at the output of input terminal 2, input trim 3, fader 7, output terminal 8, and each stage of the frequency processing section 20A.

Figure 2:
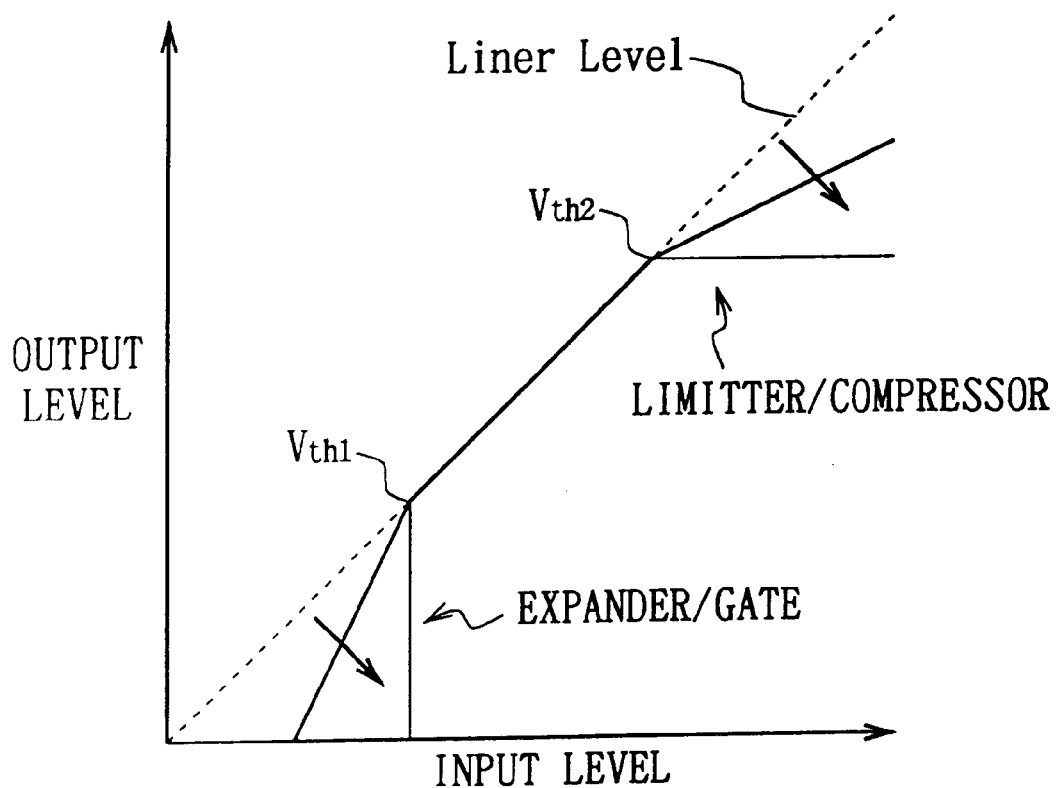
FIG. 2 is a schematic diagram explaining an amplitude processing.

For this purpose, the lower threshold $V_{th1}$ and upper threshold $V_{th2}$ are preset to the level control signal generating section 23 for a specific input level on the basis of an input-output level curve (amplitude characteristic) (FIG. 2) of an output signal with respect to an input signal. Further, a desired reduction amount is preset for input signals which are lower than the threshold $V_{th1}$ or higher than the threshold $V_{th2}$. The input-output level curve shows that the output level is decreased if the input level is lower than the threshold $V_{th1}$, thereby decreasing noise level to effectively emphasize the necessary sounds, and the output level is decreased if the input level is higher than the threshold $V_{th2}$, thereby preventing the maximum amplitude of the audio input signal from increasing to a level at which the mixer 20 can not normally process the signal.

The gain reduction section 21 multiplies the audio input signal S1 input thereto by the control voltage Vc output from the level control signal generating section 23, thereby setting the output level of the audio signal. In this case, the control signal produced by the level control signal generating section 23 is the only factor that determines the amplitude processing. Therefore, the gain reduction section 21 may be placed separately from the level control signal generating section 23 but connected remotely thereto, thereby implementing a simple circuit configuration as well as saving manufacturing costs.

The level control signal generating section 23 computes a reduction amount in accordance with the input level of the output signal derived over the signal lines L1–L6. The gain reduction section 21 performs the amplitude processing on the audio input signal in accordance with the computed reduction amount. The resulting audio input signal S2 is output via output terminal 8.

(2) The Operation of the Embodiment

With the aforementioned construction, the input trim 3 performs the fine adjustment of signal level of the audio input signal S1 input via the input terminal 2, and the frequency processing section 20A which includes the high-pass filter 4 and low-pass filter 5, and equalizer 6 performs the frequency processing on the audio input signal S1. The audio signal that has been subjected to the frequency processing is controlled by the fader 7 to a predetermined output level before it is output to the gain reduction section 21.

When the switcher 22 is switched to connect the signal line L1 to the level control signal generating section 23, the signal is directed from the input terminal 2 to the level control signal generating section 23. Likewise, the switcher 22 is switched to direct audio signals at the respective signal lines L2 to L6 to the level control signal generating section 23. That is, the switcher 22 is switched to selectively connect one of the signal lines L2–L6 to the level control signal generating section 23, so that the output signal having been subjected either to the level control or to the frequency processing is selected from the input trim 3, fader 7, or a corresponding one output stage in the frequency processing section 20A. The selected output is directed to the level control signal generating section 23.

Incidentally, the switcher 22 is of simple construction just enough for switching the lines L1 to L6 to selectively connect to the level control signal generating section 23.

In this manner, the level control signal generating section 23 can receive the output signals from the respective stages, i.e., output signals that have been subjected to the frequency processing at the respective stages of the frequency processing section 20A or that have been subjected to the amplitude processing by the input trim 3 or fader 7. Using these output signals, a reduction amount can be applied to the signal output in accordance with the frequency processing and/or amplitude processing. When selectively receiving the output signals from the respective stages, the main signal line BL is not switched by the switcher and only the audio signal as information is output to the level control signal generating section 23. This can prevent switching noise from entering the audio input signal which is subjected to the frequency processing.

The level control signal generating section 23 outputs the control voltage Vc to the gain reduction section 21, the control voltage Vc being in accordance with the reduction amount. Thus, the gain reduction section 21 multiplies the audio input signal transmitted over the main signal line BL along the while being subjected to the frequency processing by the control voltage Vc produced by the level control signal generating section 23, thereby outputting to the output terminal 8 the audio signal S2 which has been subjected to the amplitude processing so that the output level is adjusted in accordance with the result of the frequency processing.

(3) Advantages of the Embodiment

With the aforementioned construction, the switcher 22 selects one of the signal lines L1 to L6 to direct the audio output signal, which has been subjected to a predetermined frequency processing at the respective stages of the frequency processing section 20A, to the level control signal generating section 23. In accordance with the output signal from the selected stage at which the audio signal has been subjected to the frequency processing, the level control signal generating section 23 produces the control voltage Vc. Then, the gain reduction section 21 multiplies the control voltage Vc by the audio input signal, thereby performing the amplitude processing on the audio input signal S1 in accordance with the signal output of the corresponding stage of the frequency processing section 20A.

The gain reduction section 21 performs the amplitude processing by multiplying the audio signal by the control voltage Vc after the audio signal has been subjected to the frequency processing. Therefore, the signal lines are not subjected to the switching operation, thereby eliminating the chance of switching noise entering the audio signal which is being transmitted over the main signal line BL.

Moreover, since there is no need that the switcher 22 switches the audio input signal so as to cause the audio signal to be directly subjected to the amplitude processing, the switcher 22 can be of simple construction which reduces overall part costs of the mixer 20.

(4) Other Embodiments

Note that, in the aforementioned embodiment, the mixer 20 for a digital signal processing is provided with the gain reduction section 21 composed of a DSP. However, the present invention is not limited thereto and a VCA (Voltage Controlled Amplifier) composed of OP amps may be used to decrease the output level of the analog signal. In this case, in order to lower an output level with respect to an input signal by 6 [dB], a control voltage of 2.5 [V] can be supplied if the reference level of the VCA is 5 [V]. Thereby, the same advantages as the aforementioned embodiment can be obtained.

Further, in the aforementioned embodiment, the signal characteristic processing section is composed of a plurality of frequency processing sections and an amplitude processing section such as a fader. However, the present invention is not limited thereto and an apparatus can have a single frequency processing section or a single amplitude section. In such a case, signal lines may be provided both on the input side and on the output side of the frequency processing section, so that the frequency processing section can be selectively connected to the level control signal generating section 23. This configuration provides the same advantage as the aforementioned embodiment.

Further, in the aforementioned embodiment, an effect processing is performed on the audio input signal S1 to be inputted to the mixer 20. However, the present invention is not limited thereto and an effect processing can be performed on an output signal after mixing signals with the mixer.

In the aforementioned embodiment, an effect processing operation is performed by the mixer 20 as an audio signal processing apparatus. However, the present invention is not limited thereto and be applied to apparatuses such as an echo apparatus in which an effect processing is usually performed by applying a frequency processing and an amplitude processing.

Further, in the aforementioned embodiment the gain reduction section 21 is provided at the end of the mixer 20. However, the present invention is not limited thereto and the gain reduction section 21 can be placed at the end of the signal lines over which a desired output signal is derived.

Further, in the aforementioned embodiment, the level control signal generating section 23 is in the form of hardware. However, the present invention is not limited thereto and a level control signal can be produced by software. It may be possible to select the signal output from the signal lines L1 to L6 with software.

Furthermore, in the aforementioned embodiment, the reduction of output level is performed by the gain reduction section 21 in accordance with the control voltage Vc. However, the present invention is not limited thereto and in the case where a wide dynamic range is not achieved during recording, the frequency processing and amplitude processing can be performed with the audio input signal maintained at a constant level and the processed signal is recorded on a magnetic tape or the like, and when reproducing such a signal, the signal level of the reproduced audio signal can be expanded to the signal level of the original audio input signal.

According to the present invention described above, selecting means selects a signal lines to take out a signal from the input stage of the signal characteristic processing means to which an audio input signal is supplied or the respective output stages of the signal characteristic processing means. Then, level control signal generating means produces a level control signal for determining an output level of an audio signal, on the basis of the taken signal. Further, output level setting means sets the output level of the audio input signal in accordance with the level control signal. Therefore, an audio signal processing apparatus having a simple construction can be realized, in which switching noise due to switching the signal lines by the selecting means is prevented from inserting into an audio output signal when controlling an output level with respect to an audio input signal.

INDUSTRIAL APPLICABILITY

In the present invention, an audio signal processing apparatus, such as an audio mixer of a sound making equipment, can be utilized for an amplitude processing of an echo equipment and at the time of recording.

What is claimed is:

1. An audio signal processing apparatus for controlling a frequency and an amplitude of an audio input signal and outputting the signal as an audio output signal, comprising:
   one or a plurality of signal characteristic processing means for receiving said audio input signal and changing a frequency characteristic and an amplitude characteristic of said audio input signal;
   a plurality of signal lines for taking out signal outputs from an input stage of said signal characteristic processing means for said audio input signal and from an output stage of said one or plurality of signal characteristic processing means;
   selecting means for selecting one of said plurality of signal lines;
   level control signal generating means for generating a control signal for determining an output level of said signal output obtained through a selected signal line based on the output of said selecting means; and
   output level setting means for adjusting a level of an output of said signal characteristic processing means in accordance with the level control signal and outputting the output as an audio output signal.

2. The audio signal processing apparatus according to claim 1, wherein
   said level control signal generating means computes a reduction amount for a level of said signal output which is higher than an upper threshold or lower than a lower threshold, based on a prescribed input/output level characteristic, to produce said control signal in accordance with the reduction amount.

* * * * *